United States Patent [19]

Mears et al.

[11] 4,052,555

[45] Oct. 4, 1977

[54] GASEOUS DIELECTRIC COMPOSITIONS

[75] Inventors: Whitney H. Mears, Buffalo; Sabatino R. Orfeo, Orchard Park, both of N.Y.

[73] Assignee: Allied Chemical Corporation, Morris Township, N.J.

[21] Appl. No.: 598,303

[22] Filed: July 23, 1975

[51] Int. Cl.[2] .......................... H05K 5/00; H01B 3/56

[52] U.S. Cl. .............................. 174/17 GF; 174/25 G; 200/144 R; 200/149 R; 200/149 A; 252/63; 252/63.5; 252/65; 252/66; 252/372; 252/373

[58] Field of Search .................... 252/63, 63.5, 65, 66, 252/372, 373; 200/149 R, 149 A, 144 R; 174/17 GF, 25 G; 317/244

[56] References Cited

U.S. PATENT DOCUMENTS

| | | | |
|---|---|---|---|
| 2,853,540 | 9/1958 | Camilli et al. | 174/17 GF |
| 2,989,577 | 6/1961 | Borg | 252/66 |
| 2,990,443 | 6/1961 | Camilli | 174/17 GF |
| 3,059,044 | 10/1962 | Friedrich et al. | 174/18 |
| 3,184,533 | 5/1965 | Eiseman et al. | 252/63.5 |
| 3,281,521 | 10/1966 | Wilson | 174/17 GF |
| 3,305,656 | 2/1967 | Devins | 252/63.2 |
| 3,390,091 | 6/1968 | Eibeck | 252/63 |
| 3,650,955 | 3/1972 | Manion et al. | 252/66 |
| 3,674,696 | 7/1972 | Griffiths | 252/66 |

*Primary Examiner*—Mayer Weinblatt
*Assistant Examiner*—John D. Smith
*Attorney, Agent, or Firm*—David W. Collins; Jay P. Friedenson

[57] ABSTRACT

Perfluorinated ethers evidence useful properties as gaseous dielectrics and do not exhibit a high carbon tracking tendency, which is commonly a problem with halogenated alkanes. Mixtures of the perfluorinated ethers with $SF_6$ and/or $CO_2$, in critical proportions which are specific to each system, evidence improved dielectric breakdown voltages. The perfluorinated ethers and mixtures of the perfluorinated ethers with $SF_6$ and/or $CO_2$ are useful in high voltage coaxial lines, transformers, minisubstations, and the like.

12 Claims, 2 Drawing Figures

GASEOUS DIELECTRIC COMPOSITIONS

BACKGROUND OF THE INVENTION

I. Field of the Invention

This invention relates to a process for the production of compositions, useful as dielectric fluids, which do not evidence substantial carbon tracking during electrical discharges therein.

II. Description of the Prior Art

During the operation of electrical equipment, such as switches, circuit breakers, transformers, and the like, arcing, sparking or glow discharges usually or occasionally occur, especially at higher voltages. Dielectric materials are commonly employed to reduce or prevent the possibility of such arcing, sparking and glow discharges. For example, solid insulators, such as ceramics or resins, may be used to support or surround electrical conductors. Or, fluid dielectric materials, such as oils or gases, may be used to insulate electrical conductors.

A related problem involves the breakdown of carbonaceous dielectric materials. During arcing, these materials tend to decompose and form carbon, which, being an electrical conductor, not only shortens the gap between conductors, but also eventually leads to carbon bridge short circuits, or carbon tracking. This is a serious problem which has plagued the electrical industry for years.

As used herein, arc interruption includes arc suppression and arc quenching, and refers to preventing or reducing arcing between electrodes. Carbon tracking suppression refers to preventing the formation of carbon during arcing.

Sulfur hexafluoride ($SF_6$) is well-known as an excellent gaseous dielectric. See, e.g., U.S. Pat. No. 3,059,044, issued to R. E. Friedrich et al., Oct. 16, 1962. It is unique in its electric arc interrupting properties. However, $SF_6$ does have a few inherent limitations: low vapor pressure at low temperatures, comparatively high freezing point, and relatively high cost.

For some years, it has been known that certain electronegatively substituted carbon compounds (halogenated alkanes) are also highly useful fluid insulators in electrical apparatus. Typical examples are dichlorodifluoromethane ($CCl_2F_2$), octafluorocyclobutane (c-$C_4F_8$), hexafluoroethane ($C_2F_6$), octofluoropropane ($C_3F_8$), decafluorobutane ($C_4F_{10}$), trichlorofluoromethane ($CCl_3F$), symdichlorotetrafluoroethane ($CClF_2CClF_2$), tetrafluoromethane ($CF_4$), chloropentafluoroethane ($CClF_2CF_3$) and chlorotrifluoromethane ($CClF_3$). While all of the above have reasonably good dielectric strength, it is difficult to prevent spark-over or other electrical discharge from occurring in apparatus containing these materials when high voltage surges develop. The spark-over or other discharge typically leads to carbon track formation.

U.S. Pat. No. 3,650,955, issued to J. A. Manion, et al., Dec. 9, 1966, teaches the use of $CCl_2F_2$ combined with c-$C_4F_8$ as an arc interrupter gas. However, this combination has been observed to evidence extensive carbon tracking properties.

A mixture of $SF_6$ and $CO_2$ has been suggested as a potential gaseous dielectric medium having arc-extinguishing characteristics. See, e.g., U.S. Pat. No. 3,059,044, above. However, no composition range over which such properties may exist is disclosed.

Perhalogenated fluids, including $SF_6$ and perhalogenated alkanes, have been adsorbed on molecular sieves (zeolites), which are then incorporated as fillers in organic insulators; see U.S. Pat. No. 3,305,656, issued to J. C. Devins, Feb. 21, 1967. During high voltage operation, voids in the insulation are filled by the perhalogenated fluid, which then serves as an arc interrupter. There is, however, no suggestion that such a combination would be useful in carbon tracking suppression.

Attempts have been made to develop gaseous dielectric compositions as carbon tracking suppressants. For example, B. J. Eiseman, U.S. Pat. No. 3,184,533, issued May 18, 1965, teaches the use of an oxygen-containing oxidizing agent, such as $SO_2$, $N_2O$ and NO, to suppress carbon tracking of certain electronegatively substituted carbon compounds, such as saturated polyhalohydrocarbon compounds, saturated perhalohydrocarbon compounds, saturated perfluoroethers and the like. However, none of these oxidizing agents is desirable because of their corrosive nature, toxicity, and/or chemical reactivity.

There remains in the art a need for an efficient gaseous dielectric composition that does not evidence carbon tracking.

SUMMARY OF THE INVENTION

In accordance with the invention, carbon tracking formation in a dielectric fluid during an electrical discharge from an electrical conductor is substantially eliminated by maintaining in contact with the electrical conductor during operation a gaseous dielectric composition consisting essentially of a member selected from the group consisting of perfluorinated ethers and mixtures of perfluorinated ethers with $SF_6$ and/or $CO_2$.

Perfluorinated ethers useful in the practice of the invention are those which contain from 2 to 6 carbon atoms and may be mono- or di-ethers, cyclic or acyclic. The perfluorinated ethers have a vapor pressure of at least about 100 Torr at 20° C and are gaseous under operating conditions.

Certain of the gaseous dielectric compositions of this invention are novel. These compositions consist essentially of mixtures of at least one of the aforesaid perfluorinated ethers and a member selected from the group consisting of $SF_6$ and $SF_6$ plus $CO_2$.

Further in accordance with the invention, improved dielectric breakdown voltages that are equal to or greater than that of the component having the highest dielectric breakdown voltage are obtained by employing mixtures of the perfluorinated ethers with $SF_6$ and/or $CO_2$ in critical proportions which are specific to each system.

DETAILED DESCRIPTION OF THE INVENTION

Figure 1:
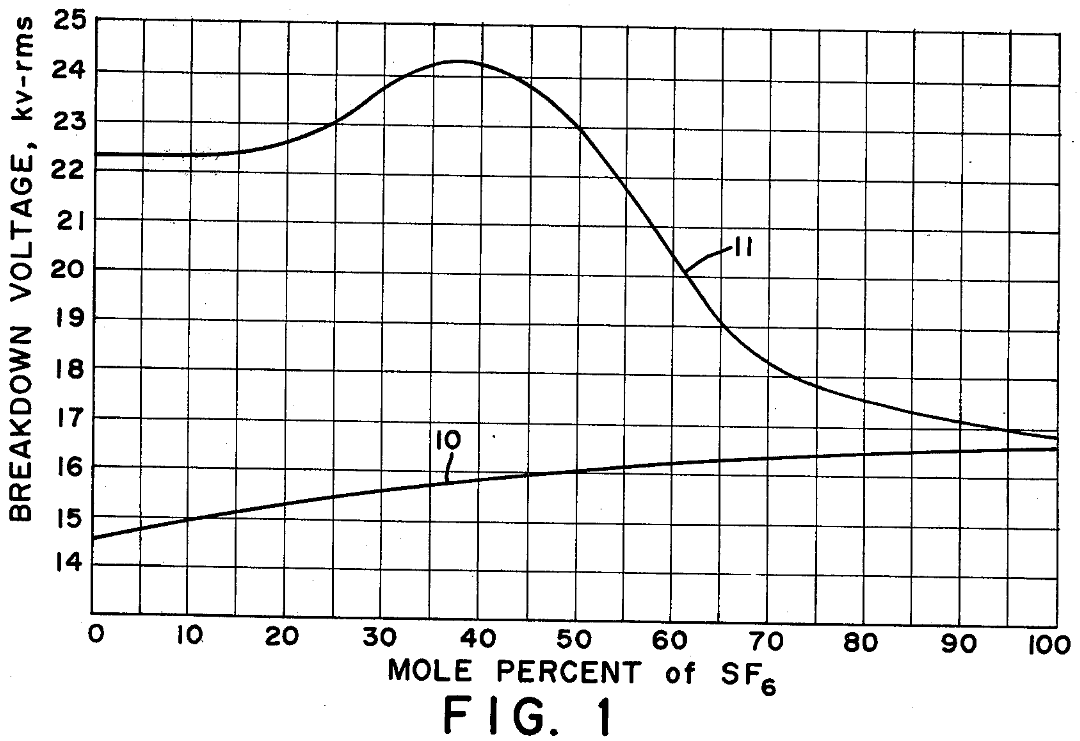
FIG. 1, on coordinates of breakdown voltage in kv-rms and concentration in mole percent, is a plot of the binary system $SF_6$-X, where X is a perfluorinated ether, showing proportions having improved dielectric strength.

In accordance with the invention, carbon tracking formation in a dielectric fluid during an electrical discharge from an electrical conductor is substantially eliminated by maintaining in contact with the electric conductor during operation a gaseous dielectric composition consisting essentially of a member selected from the group consisting of perfluorinated ethers and mixtures of perfluorinated ethers with $SF_6$ and/or $CO_2$.

Perfluorinated ethers useful in the practice of the invention are those which contain from 2 to 6 carbon atoms and may be mono- or di-ethers, cyclic or acyclic. The perfluorinated ethers have a vapor pressure of at least about 100 Torr at 20° C. Such a vapor pressure limitation permits the use of certain perfluorinated ethers which are liquid at room temperature but which evidence a sufficiently high vapor pressure to be useful over a limited range of composition. Preferably, the perfluorinated ethers have a vapor pressure of at least about 400 Torr at 20° C. and most preferably, are totally gaseous (760 Torr) at room temperature and have a boiling point of less than about 5° C.

Examples of perfluorinated ethers useful in the practice of the invention include perfluorodimethyl ether, $(CF_3)_2O$, perfluorodiethyl ether, $(C_2F_5)_2O$, perfluoro-1,4-dioxane,

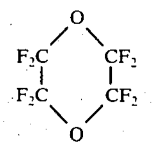

perfluoro-1,2-dimethoxy ethane, $CF_3O(CF_2)_2OCF_3$, perfluoro-1,2-epoxyethane,

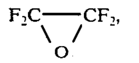

perfluoro-1,3-epoxypropane,

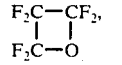

and perfluoro-2,3-epoxy-2-methylbutane,

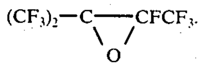

Unexpectedly, in many of these systems, improved dielectric breakdown voltages that are equal to or greater than that of the component having the highest dielectric breakdown voltage are obtain-by employing mixtures of the perfluorinated ethers with $SF_6$ and/or $CO_2$ in critical proportions which are specific to each system.

Gaseous dielectric compositions which do not evidence carbon tracking when subjected to repeated electrical sparking (breakdown) are desired for use in high voltage apparatus. This objective is attained by employing perfluorinated ethers or mixtures of perfluorinated ethers with $SF_6$ and/or $CO_2$. All compositions disclosed herein have utility as gaseous dielectric compositions that do not evidence carbon tracking. As such, they have application in electrical apparatus, especially high voltage power equipment, such as transformers, capacitors, coaxial lines and minisubstations, having a chamber in which electrical arcing occasionally occurs and which includes the gaseous dielectric mixture. Some of the mixtures are particularly useful in certain specific areas, such as for extreme temperature conditions, when high dielectric strength is required.

Mixtures of the perfluorinated ethers with $SF_6$ may contain from about 1 to 99 mole percent of $SF_6$. The presence of $SF_6$ serves to increase the vapor pressure of the mixture and reduce its cost. An increased vapor pressure is desirable, since as temperature is decreased, the gas density correspondingly is decreased, with an accompanying decrease in breakdown voltage. Increased vapor pressure serves to maintain a high breakdown voltage.

Mixtures of the perfluorinated ethers with $CO_2$ may contain from about 1 to 75 mole percent of $CO_2$. For $CO_2$ mixtures, only compositions having a breakdown voltage of greater than about 10 kv-rms are considered useful. Typically, use of greater than about 75 mole percent of $CO_2$ in these mixtures results in a breakdown voltage of less than about 10 kv-rms. The combination of $CO_2$ with perfluorinated ethers serves the same function as $SF_6$.

Mixtures of one or more of the perfluorinated ethers with $SF_6$ plus $CO_2$ also result in further reduction in cost with little sacrifice in the desirable properties described above. Examples of such compositions include $SF_6$—$CO_2$—$(CF_3)_2O$ and $SF_6$—$CO_2$—$(C_2F_5)_2O$.

Preferred mixtures of the perfluorinated ethers with $SF_6$ and/or $CO_2$ are those which retain 90% of the dielectric breakdown voltage of the highest component. For example, employing the methods described by ASTM D2477-66T, a mixture of $SF_6$ and $(C_2F_5)_2O$ over the range of about 1 to 60 mole percent of $SF_6$ evidences a dielectric breakdown voltage of at least 20.0 kv-rms (kilovolt-root mean square), which is 90% of the dielectric breakdown voltage of pure $(C_2F_5)_2O$, the component having the higher dielectric breakdown voltage.

Unexpectedly, some combinations of perfluorinated ethers with $SF_6$ and/or $CO_2$ within the proportions disclosed above evidence an enhancement of dielectric strength, as measured by breakdown voltage. Examples of such systems include $SF_6$—$(CF_3)_2O$, $SF_6$—$(C_2F_5)_2O$ and $CO_2$—$(C_2F_5)_2O$. It would be expected that for binary compositions, breakdown voltage would vary linearly with composition. However, for some compositions, an unexpected enhancement of breakdown voltage is observed. This may take the form either of a moderate positive deviation from linearity or of a significant positive deviation from linearity to the extent that over some range of composition, the observed breakdown voltage is equal to or greater than that of either of the two end members. The latter condition is referred to herein as a synergistic effect. Although it is not possible to define general composition ranges, such a determination is easily within the ability of one skilled in the art. For example, employing the methods described by ASTM D2477-66T, a mixture of $SF_6$ and $(C_2F_5)_2O$ over the range of about 1 to 55 mole percent of $SF_6$ evidences a dielectric breakdown voltage of at least 22.1 kv-rms (kilovolt-root mean square). At 40 mole percent of $SF_6$, this value is observed to rise to 24.3 kv-rms. The dielectric breakdown voltages of pure $SF_6$ and pure $(C_2F_5)_2O$ are 16.79 and 22.1 kv-rms, respectively.

Similarly, a mixture of $CO_2$ and $(CF_3)_2O$ over the range of about 1 to 45 mole percent of $CO_2$ and a mixture of $CO_2$ and $(C_2F_5)_2O$ over the range of about 1 to 50 mole percent of $CO_2$ both evidence a synergystic effect.

The considerations in choosing a particular system include the cost of the components, the temperature performance desired (low or high), the electrical properties desired, and the relative safety of the total mixture.

EXAMPLES

Breakdown voltage (BDV) was measured by equipment which included a glass breakdown voltage cell as described by ASTM D2477-66T, a 50 kv-rms (kilovolt-root mean square), 60 Hz, 5 kva transformer and suitable accessory circuits, including 40,000 ohms of 250 watt current limiting resistors. A vacuum manifold with Bourdon Tube type manometer, solenoid valves and controls was also used.

The cell had an 0.75 inch sphere and a 1.5 inch plane electrodes. The breakdown cell filling manifold, using solenoid valves, furnished connections to the cell, the manometer, various gas inlets and the vacuum pump. The manometer was a Wallace and Tiernan model 62A-4D-0800, ranging in two rotations of the indicator needle between 0 and 800 Torr absolute. A simple control panel governed the solenoid valves used to admit the various gases of the mixtures in the BDV cell. The BDV measurement conditions were 60 Hz, 0.100 inch gap, 760 Torr total pressure and ambient room temperature. Compositions were prepared in terms of partial pressure, accurate to $\pm$ 0.5 Torr, and converted to mole percent, assuming ideal gas law behavior.

The electrodes had to be polished prior to taking BVD data. They were polished with E5 emery grit, soaked in xylene for 30 min, rinsed with petroleum ether and dried at 100° C for 15 min. A few preliminary breakdown voltage shots were necessary prior to taking data to condition the electrodes. Even so, the BDV of pure components, such as $SF_6$ and $CO_2$, was observed to vary slightly from one experiment to the next.

An air gap of two 12.5 cm diameter brass spheres served for a peak voltage calibration standard. Prior to measurements, the transformers voltmeters were calibrated with this gap using the BDV methods of ASTM D-2477-66T, i.e., averaging 5 successive spark breakdowns at set gap distances. The meters were accurate to 0.5 kv, or within calibration.

For measuring carbon formation suppression, there were two levels of testing. In the first, any carbon appearing after 5 BDV shots were monitored as a "go-no go" test. For a more severe exposure test, 50 successive BDV shots were taken in the same manner. If carbon appeared, the BDV cell was disassembled and the electrodes cleaned and conditioned again.

Carbon tetrafluoride, $CF_4$, the most stable fluorocarbon known, and nitrogen, $N_2$, served as inert diluents and blanks. In the test for carbon formation, the measurements started at high $SF_6$ or $CO_2$ concentrations. These concentrations were gradually varied from high $SF_6$ or $CO_2$ to high perfluorinated carbon. Carbon, if it formed at all, was usually observed to form on the grounded plane electrode.

The breakdown voltage data for binary mixtures of perfluorinated ethers with $SF_6$ or $CO_2$ is listed in the Table below. From the data given, the useful range for gaseous dielectric behavior may be determined. Many binary mixtures evidenced breakdown voltage values within about 90% of that of the higher end member over a range of compositions; such mixtures are preferred. Certain binary mixtures evidenced unusually high breakdown voltage values compared with the values of either end member. Since the normal expected behavior is a linear dependence with composition, such unusual behavior is termed a synergistic effect, and such mixtures are also preferred. Following the Table is a discussion of binary mixtures which include $SF_6$ or $CO_2$.

In general, $CO_2$ binary mixtures tended to evidence less BDV synergism than do the $SF_6$ binary mixtures. Except in special applications, such as low voltage use, mixtures evidencing breakdown voltages of less than about 10 kv-rms are not considered to be as useful as those greater than about 10 kv-rms.

No carbon tracking was observed within the limits of the test, even for the pure perfluorinated ethers.

Figure 2:
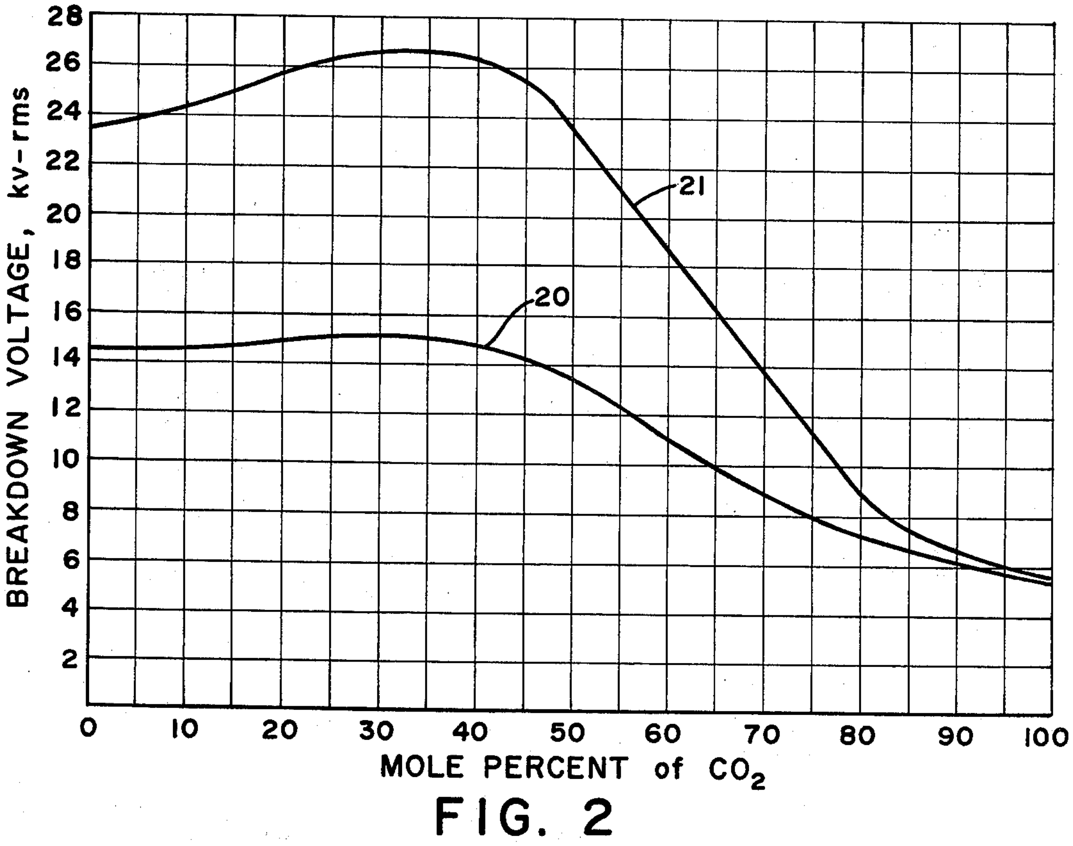
FIG. 2, on coordinates of breakdown voltage in kv-rms and concentration in mole percent, is a plot of the binary system $CO_2$-X, showing proportions having improved dielectric strength.

FIGS. 1 and 2 depict the breakdown voltage of mixtures of some perfluorinated ethers with $SF_6$ and $CO_2$, respectively. It is apparent that there is deviation from linearity, ranging from a slightly positive deviation for curve 10 to a substantial deviation for curves 11 and 21. The curves are plotted from the data of the Table.

TABLE

BINARY MIXTURES WITH $SF_6$ OR $CO_2$

| Composition | Breakdown Voltage, kv-rms, as a Function of $SF_6$ or $CO_2$ Addition (mole percent) | | | | | | | | | | |
|---|---|---|---|---|---|---|---|---|---|---|---|
| | 0 | 10 | 20 | 30 | 40 | 50 | 60 | 70 | 80 | 90 | 100 |
| $SF_6$ | | | | | | | | | | | |
| $(CF_3)_2O$ | 14.54 | 14.90 | 15.22 | 15.51 | 15.64 | 15.96 | 16.25 | 16.27 | 16.50 | 16.32 | 16.38 |
| $(C_2F_5)_2O$ | 22.1 | 22.2 | 22.5 | | 24.3 | 22.67 | 20.54 | 18.33 | 17.66 | 17.37 | 16.79 |
| $CO_2$ | | | | | | | | | | | |
| $(CF_3)_2O$ | 14.45 | 14.56 | 14.72 | 15.08 | 14.61 | 12.74 | 11.46 | 9.16 | 7.27 | 6.26 | 5.50 |
| $(C_2F_5)_2O$ | 23.24 | 24.47 | 24.88 | 26.43 | 26.30 | 23.35 | 18.80 | 14.52 | 8.11 | 6.69 | 5.54 |

EXAMPLE 1

System $SF_6$—$(CF_3)_2O$ (FIG. 1, Curve 10)

Both pure $(CF_3)_2O$ and mixtures with $SF_6$ over the entire range of $SF_6$ addition (about 1 to 99 mole percent of $SF_6$) evidenced useful dielectric behavior. The BDV was at least 90% that of $SF_6$ over the range of about 10 to 99 mole percent of $SF_6$.

EXAMPLE 2

System $SF_6$—$(C_2F_5)_2O$ (FIG. 1, Curve 11)

Both pure $(C_2F_5)_2O$ and mixtures with $SF_6$ over the entire range of $SF_6$ addition (about 1 to 99 mole percent of $SF_6$ evidenced useful dielectric behavior. The BDV was at least 90% that of $(C_2F_5)_2O$ over the range of about 1 to 60 mole percent of $SF_6$. There was a synergistic BDV effect from about 1 to 55 mole percent of $SF_6$.

EXAMPLE 3

System $CO_2$—$(CF_3)_2O$ (FIG. 2, Curve 20)

Both pure $(CF_3)_2O$ and mixtures with $CO_2$ over the range of about 1 to 65 mole percent of $CO_2$ addition evidenced useful dielectric behavior. The BDV was at least 90% that of $(CF_3)_2O$ over the range of about 1 to 50 mole percent of $CO_2$. There was a slight synergistic BDV effect from about 1 to 45 mole percent of $CO_2$.

EXAMPLE 4

System $CO_2$—$(C_2F_5)_2O$ (FIG. 2, Curve 21)

Both pure $(C_2F_5)_2O$ and mixtures with $CO_2$ over the range of about 1 to 75 mole percent of $CO_2$ evidenced useful dielectric behavior. The BDV was at least 90% that of $(C_2F_5)_2O$ over the range of about 1 to 45 mole percent of $CO_2$. There was a syneristic BDV effect over the range of about 1 to 50 mole percent of $CO_2$.

What is claimed is:

1. A process for substantially eliminating carbon tracking formation in a dielectric fluid during an electrical discharge from an electrical conductor which comprises maintaining in contact with the electrical conductor during operation a gaseous dielectric composition consisting essentially of a mixture of at least one perfluorinated ether with from about 1 to 99 mole percent of $SF_6$ and/or with from about 1 to 75 mole percent of $CO_2$, said perfluorinated ether containing from 2 to 6 carbon atoms and having a vapor pressure of at least of about 100 Torr at 20° C.

2. The process of claim 1 in which the perfluorinated ether has a vapor pressure of at least about 400 Torr at 20° C.

3. The process of claim 1 in which the perfluorinated ether is totally gaseous at room temperature and has a boiling point of less than about 5° C.

4. The process of claim 1 in which the perfluorinated ether consists essentially of at least one compound selected from the group consisting of $(CF_3)_2O$ and $(C_2F_5)_2O$.

5. The process of claim 1 in which the gaseous dielectric composition consists essentially of a mixture of at least one perfluorinated ether with from about 1 to 99 mole percent of $SF_6$.

6. The process of claim 1 in which the gaseous dielectric composition consists essentially of a mixture of at least one perfluorinated ether with from about 1 to 75 mole percent of $CO_2$.

7. A process for substantially eliminating carbon tracking formation and for improving dielectric strength in a dielectric fluid during an electrical discharge from an electrical conductor which comprises maintaining in contact with the electrical conductor during operation a gaseous dielectric composition consisting essentially of at least one mixture selected from the group consisting of $SF_6$—$(C_2F_5)_2O$ over the range of about 1 to 55 mole percent of $SF_6$, $CO_2$—$(CF_3)_2O$ over the range of about 1 to 45 mole percent of $CO_2$, and $CO_2$—$(C_2F_5)_2O$ over the range of about 1 to 50 mole percent of $CO_2$.

8. A composition for substantially eliminating carbon tracking formation, characterized in that the composition consists essentially of a mixture of at least one perfluorinated ether and a member selected from the group consisting of about 1 to 99 mole percent of $SF_6$ and about 1 to 99 mole percent of $SF_6$ plus about 1 to 75 mole percent of $CO_2$, said perfluorinated ether having from 2 to 6 carbon atoms and a vapor pressure of at least about 100 Torr at 20° C.

9. The composition of claim 8 in which the vapor pressure of the perfluorinated ether is at least about 400 Torr at 20° C.

10. The composition of claim 8 in which the vapor pressure of the perfluorinated ether is totally gaseous at room temperature and has a boiling point of less than about 5° C.

11. The composition of claim 8 in which the perfluorinated ether consists essentially of at least one compound selected from the group consisting of $(CF_3)_2O$ and $(C_2F_5)_2O$.

12. In combination:

a. electrical apparatus having a chamber in which electric arcing occasionally occurs and in which dielectric strength is maintained; and b. a gaseous dielectric composition in said chamber for substantially eliminating carbon tracking formation and for electrical and insulating purposes, said gaseous dielectric composition consisting essentially of a mixture of at least one perfluorinated ether with from about 1 to 99 mole percent of $SF_6$ and/or with from about 1 to 75 mole percent of $CO_2$, said perfluorinated ether containing from 2 to 6 carbon atoms and having a vapor pressure of at least about 100 Torr at 20° C.

* * * * *